United States Patent [19]

Imhauser

[11] Patent Number: 5,416,032
[45] Date of Patent: May 16, 1995

[54] METHOD OF MAKING A HIGH CONDUCTIVITY P-PLUS REGION FOR SELF-ALIGNED, SHALLOW DIFFUSED, BIPOLAR TRANSISTORS

[75] Inventor: William P. Imhauser, Ambler, Pa.

[73] Assignee: SGS-Thomson Microelectronics, Inc., Carrollton, Tex.

[21] Appl. No.: 265,855

[22] Filed: Jun. 24, 1994

[51] Int. Cl.⁶ .................. H01L 21/265; H01L 21/70; H01R 21/22
[52] U.S. Cl. ........................ 437/31; 437/27; 437/55; 437/147; 437/978
[58] Field of Search ........................ 437/31, 32, 55, 27, 437/147, 978

[56] References Cited

U.S. PATENT DOCUMENTS

| | | | |
|---|---|---|---|
| 3,725,150 | 4/1973 | George | 437/147 |
| 4,055,884 | 11/1977 | Jambotkar | 437/978 |
| 4,110,126 | 8/1978 | Bergeron et al. | 437/32 |
| 4,201,800 | 5/1980 | Alcorn et al. | 437/147 |
| 5,328,857 | 7/1994 | Imhauser | 437/31 |

Primary Examiner—Olik Chaudhuri
Assistant Examiner—Brian K. Dutton
Attorney, Agent, or Firm—Renee M. Larson; Lisa K. Jorgenson; Richard K. Robinson

[57] ABSTRACT

According to the present invention, using an emitter-P+ (E-P) mask, a low resistance, high conductivity P+ region of a self-aligned bipolar transistor device is formed prior to the formation of a base region. The P+ diffusion and drive can thus be accomplished without concern for adverse effects on the base region of the bipolar transistor device, which is yet to be formed. After the P+ diffusion and drive step, the emitter of the bipolar transistor device is uncovered and a base mask used to allow a base implant step. A high base implant energy of approximately 35 to 40 KEV is used to completely penetrate the E-P mask layers, thereby providing a usable, linked base region in the active areas of the bipolar transistor device.

19 Claims, 3 Drawing Sheets

METHOD OF MAKING A HIGH CONDUCTIVITY P-PLUS REGION FOR SELF-ALIGNED, SHALLOW DIFFUSED, BIPOLAR TRANSISTORS

FIELD OF THE INVENTION

The present invention relates generally to integrated circuit bipolar transistors, and more specifically to a method of manufacturing integrated circuit self-aligned, shallow diffused, bipolar transistors having low resistance, high conductivity base regions.

BACKGROUND OF THE INVENTION

According to the prior art, it is well known that in order to ensure a shallow base junction during a diffusion process sequence of a bipolar transistor device, a deep P+ region can not be formed after a base diffusion or implant process, since the base junction depth is a direct function of time and temperature. If the base is already present during the P+ drive step, the base along with the P+ region will be driven deep as well, thereby not allowing shallow base depths. Thus, in the prior art, the base implant energy has been limited to approximately 25 KEV. It has been assumed, for certain devices, such as those devices having "overlay geometries", "fishbone geometries", and other geometries requiring close lateral spacing of base and emitter electrodes, that if a low resistance, high conductivity base is required to conduct significant base currents without excessive voltage drops, then the self-alignment feature was not possible, since emitter and base must be defined simultaneously, according to the prior art.

Definition of the emitter and base of a bipolar transistor is typically accomplished with a mask referred to as an emitter-P+ or "E-P" mask. While the self-alignment feature is desirable because of the superior uniformity of injection and perfect alignment accuracy it provides, it limits the ability to achieve a low resistance P+ region, since the base must already be diffused or implanted underneath the "E-P" layer. Many methods have tried to minimize the P+ sheet resistance, such as heavy implant doses of long duration, high energy implants which allow greater depths but which require impractically thick masking layers, and short, high temperature rapid thermal anneals (RTA) process steps, all with little success. For example, utilization of these known methods, which may be very complex, for generating high conductivity P+ regions, will only yield a P+ sheet resistance as low as approximately 20 Ohms per square. It would be desirable to minimize this resistance even more.

Thus, there is a current unmet need in the art to be able to manufacture a self-aligned bipolar transistor device having a low resistance, high conductivity P+ region as well as a low resistance, high conductivity, shallow base region.

SUMMARY OF THE INVENTION

It would be advantageous in the art to manufacture a self-aligned bipolar transistor device having a low resistance, high conductivity P+ region and a low resistance, high conductivity, shallow base region.

Therefore, according to the present invention, using an emitter-P+ (E-P) mask, a low resistance, high conductivity P+ region of a self-aligned bipolar transistor device is formed prior to the formation of a base region. The P+ diffusion and drive can thus be accomplished without concern for adverse effects on the base region of the bipolar transistor device, which is yet to be formed. A high base implant energy of approximately 35 to 40 KEV is used to completely penetrate the E-P mask layers, thereby providing a usable, linked base region in the active areas of the bipolar transistor device.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

According to the present invention, it is possible to manufacture a self-aligned bipolar transistor device having a low resistance, high conductivity P+ region and a shallow base region. Using an emitter-P+ (E-P) mask, a low resistance, high conductivity P+ region of a self-aligned bipolar transistor device is formed prior to the formation of a base region.

Figure 1:
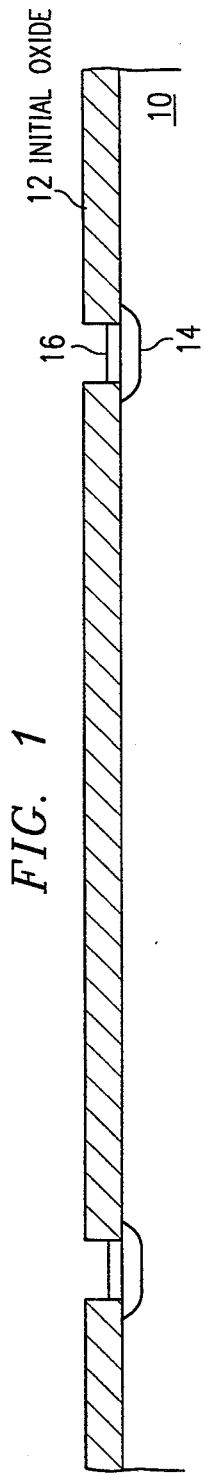
FIGS. 1–10 are cross-sectional views of a bipolar transistor semiconductor device at various stages of manufacture, according to the present invention.
Figure 2:
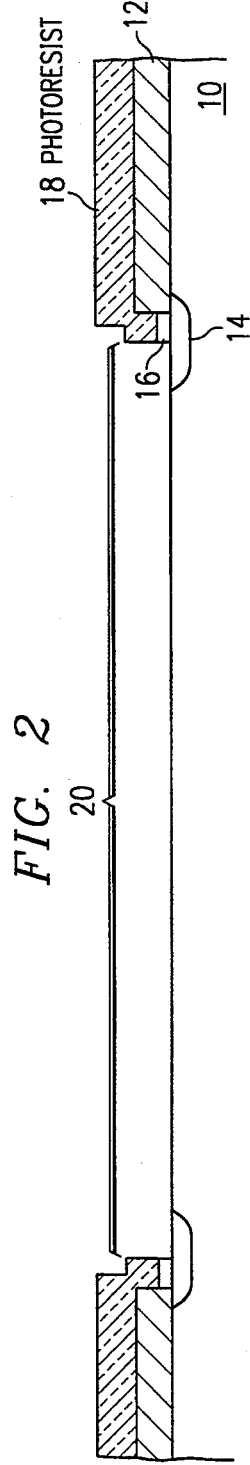
Figure 3:
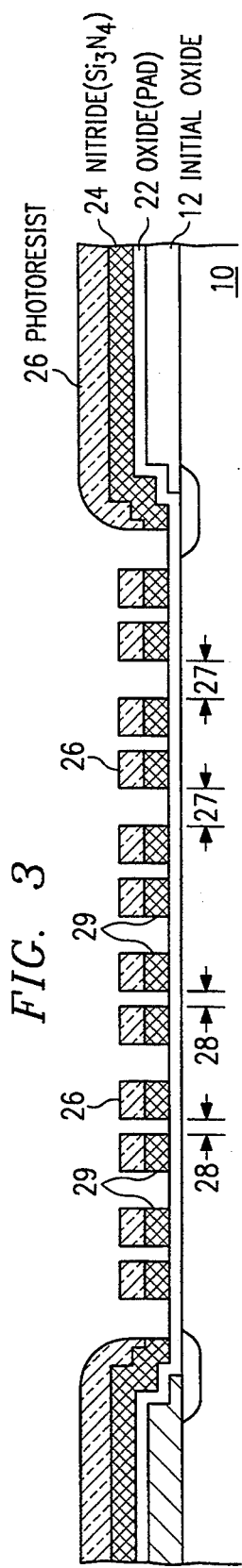

Referring to FIG. 1, the initial step in forming a bipolar transistor according to the present invention is to grow an initial layer of oxide 12 on the top surface of epitaxial layer 10. Next, a moat is etched in oxide layer 12, so that a P− implant and drive, using P− material such as Boron $B_{11}$, may be performed to form P− region 14. The P− drive also forms a layer of oxide 16, which is more shallow than oxide layer 12, as shown. Next, referring to FIG. 2, photoresist layer 18 is deposited as shown over a portion of oxide layer 12 and a portion of oxide layer 16, followed by an etching step to define base opening 20. Referring to FIG. 3, "pad" oxide layer 22 is grown, followed by chemical vapor deposition (CVD) of silicon nitride ($Si_3N_4$) layer 24; pad oxide layer 22 and silicon nitride layer 24 together form the E-P mask. Pad oxide layer 22 has a depth of approximately 200 Å to 250 Å, while silicon nitride layer 24, an insulating layer, is approximately 600 Å to 1000 Å, in depth. Next, photoresist layer 26 is formed over select portions of silicon nitride layer 24; those portions of silicon nitride layer 24 are next patterned and dry etched to define self-aligned emitter regions 28 and P+ areas 27 where P+ regions will be formed later, thereby defining a self-aligned E-P mask; pad oxide layer 22 stops the dry etch, as shown in FIG. 3. In the process of dry etching portions of silicon nitride layer 24, insulating silicon nitride spacers 29 are formed. Photoresist layer 26 is then removed.

Figure 4:
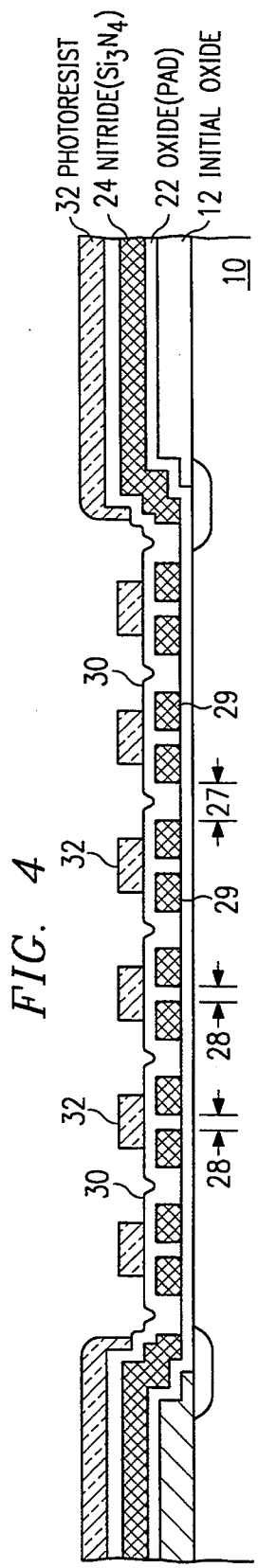
Figure 5:
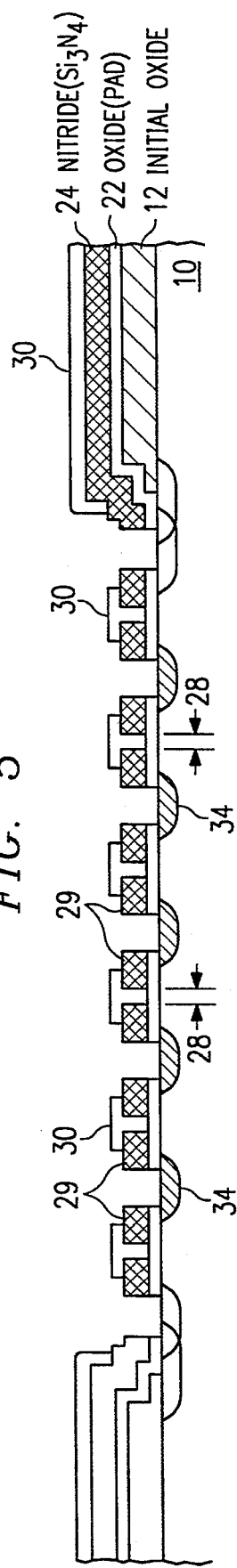

The E-P mask of FIG. 3 will now be opened for emitter region 28 covered P+ diffusion, as shown in FIG. 4. After photoresist 26 has been removed, CVD of oxide layer 30 is formed over the entire structure and is then patterned to function as a P+ region opener of P+ areas 27. Next, photoresist layer 32 is placed over emitter regions 28, but P+ areas 27 are left open. Oxide layer 30 and the strategic placement of photoresist layer 32 protect emitter regions 28. Referring to FIG. 5, after the portions of oxide layer 30 which are not covered by photoresist layer 32 are etched away, P+ material, such as Boron Chloride $BCl_3$, is deposited and driven deep in P+ areas 27 to form low resistivity P+ regions 34. In addition to Boron Chloride, Boron Nitride BN may be used as the P+ material. According to the present invention, P+ regions 34 are formed prior to base formation. Therefore, P+ regions 34 can be formed without regard for adverse effects on the base regions, which are yet to be formed.

Figure 6:
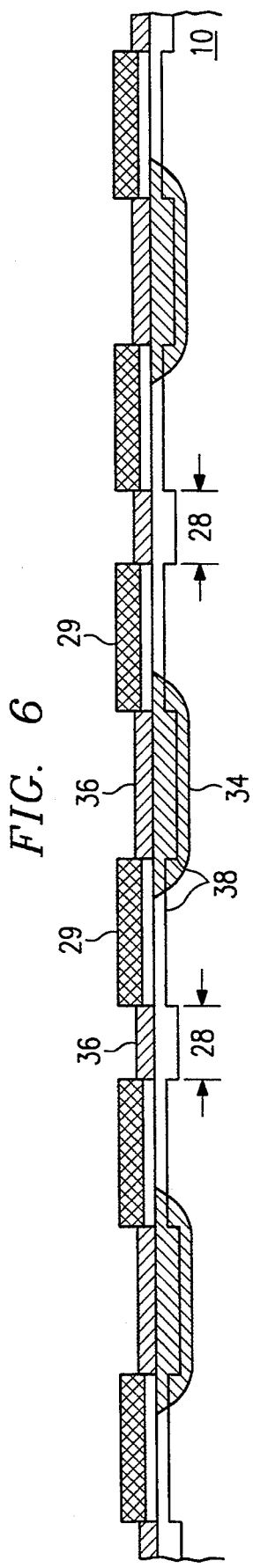

Referring now to FIG. 6, the scale of the bipolar transistor device has been enlarged. After the P+ diffusion and drive of FIG. 5 is completed and the resistance of P+ regions 34 measured, emitter regions 28 are uncovered by etching away the remainder of oxide layer 30. Next, oxide layer 36 is formed by oxidation at approximately 900° C. to 950° C. in dry oxygen. Approximately 300 Å to 500 Å of oxide layer 36 is grown in both emitter regions 28 and P+ regions 34 as shown in FIG. 6. Next, the entire device is implanted with P− Boron $B^{11}$ base material at a high enough implantation energy to place the peak dosage of Boron base layer 38 at or near the silicon interface under nitride spacers 29. The $B^{11}$ implant energy necessary for penetration of nitride spacers 29 is approximately 35 to 40 KEV, as compared to the 25 KEV base implantation energy of prior art solutions. Base implant activation and partial drive are performed in FIG. 7, followed by deposition of oxide layer 40. Emitter opener 42 is defined by patterning and etching away the portions of dry oxide layer 36 over emitter regions 28.

There is some variation in the vertical depth in areas not covered by the oxide-nitride E-P mask which may be minimized by an additional thermal oxidation step to grow oxide in the open "cuts" of the emitter and P+ regions, as shown in FIG. 6. The only variation of importance is the variation in the vertical depth of emitter regions 28, since P+ regions 34 are "swamped out" by the heavy boron concentration in the P+ region. If the open emitter is oxidized to a thickness of approximately 400 Å, there will only be a slight depth variation between the oxide-nitride layers, which will have a total depth of approximately 800 Å, versus the oxidized emitter which has a depth of approximately 400 Å.

For example, choosing a base implant energy of 35 KEV and a $B^{11}$ dosage of 8 $E^{13}$, the base implant will peak slightly below the oxide-nitride interface, and will allow an "effective" energy of 35 KEV minus approximately 13 KEV, for an effective implant energy of 22 KEV for an emitter with approximately 400 Å of oxide. The final dose distribution will have almost the full dose into the emitter areas and approximately one-half the dose underneath the oxide-nitride E-P mask (since the placement of the peak at or near the oxide-nitride interface allows only half the dose into the silicon).

Figure 8:
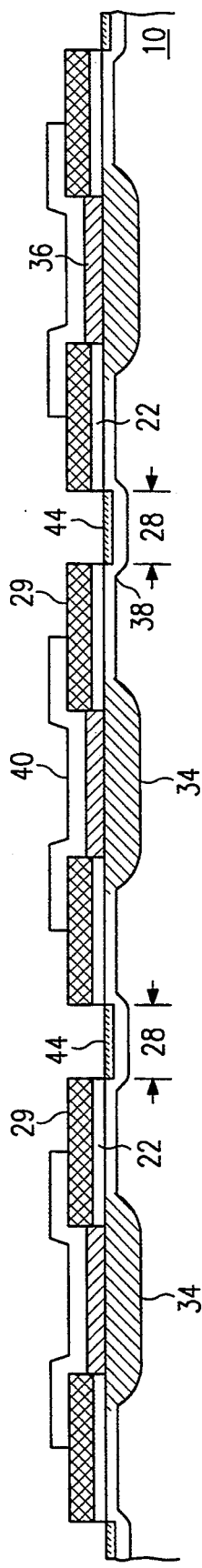
Figure 9:
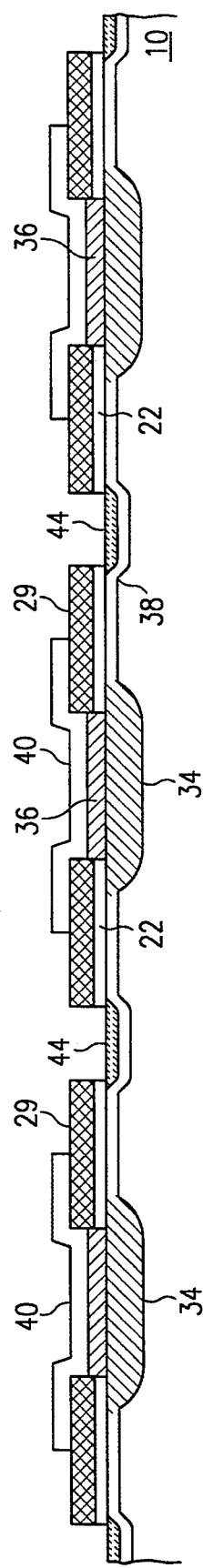
Figure 10:
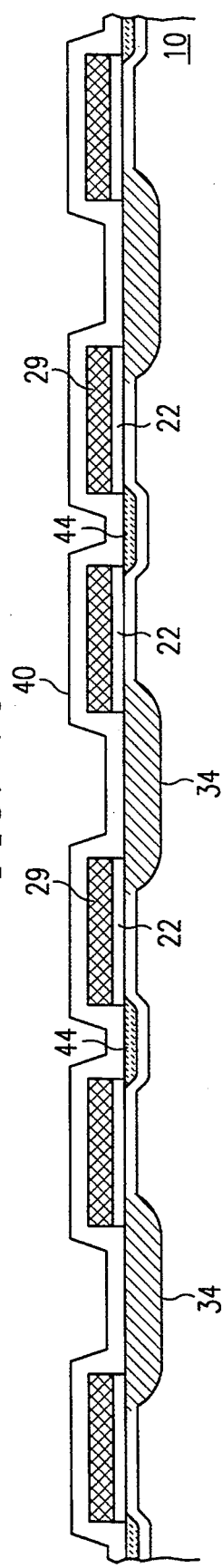

Referring to FIG. 8, emitter regions 28 are implanted with Arsenic, forming Arsenic regions 44, followed by a drive of emitter regions 28 which increases the size of Arsenic region 44, shown in FIG. 9, and thus the DC current gain $h_{FE}$ and base width characteristics of the bipolar transistor device. As an option, emitter regions 28 may be capped in order to prevent evaporation of Arsenic region 44. This may be accomplished as shown in FIG. 10, where oxide layer 40 covers the entire semiconductor structure, including Arsenic regions 44. Oxide layer 40 also forms the basis for subsequent photoresist steps and other standard process steps which may now be performed. For example, for an "overlay geometry", a polycrystalline-silicon contact would next be formed, followed by standard processing steps.

Figure 7:
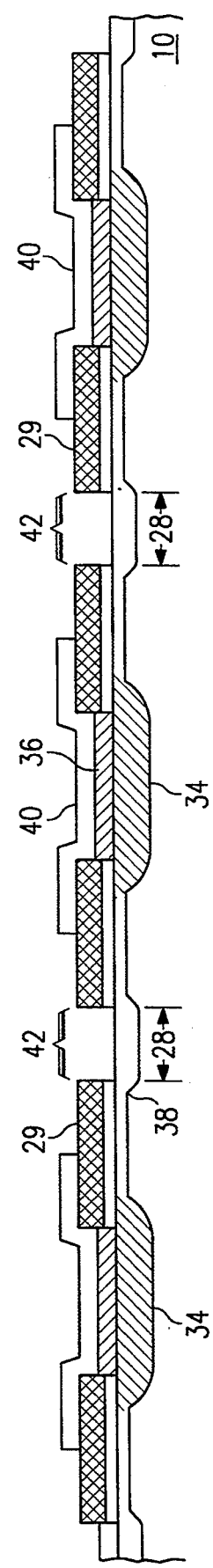

The present invention offers the unique advantage of allowing the use of an E-P mask prior to the base implant step of FIG. 7, rather than contemporaneous with the base implant step. The E-P mask is then opened for the P+ diffusion, emitter covered, step of FIG. 4, and the P+ diffusion and drive of FIG. 5 can then occur without regard for adverse effects on the base, since the device has not yet been implanted with base doping, such as boron. After the P+ diffusion and drive step is completed and measured for P+ resistance, the emitter is uncovered as shown in FIG. 6, and the base mask is used to allow the base implant. The unique use of a very thin pad oxide layer 22 having a depth of approximately 200 Å to 250 Å, which is thermally grown for the E-P mask step, followed by CVD of thin silicon nitride layer 24, which has a depth of approximately 600 Å to 1000 Å, allows a somewhat higher base implant energy of approximately 35 KEV to 40 KEV, as compared to the base implant energy of approximately 25 KEV for the prior art, to completely penetrate the E-P layers, thereby allowing a usable, linked base region 38 in the active areas of the semiconductor device, as shown in FIGS. 6 and 7. The depth of thin silicon nitride layer 24 may be chosen in the range of approximately 600 Å to 1000 Å as desired, according to individual process and device requirements. Obviously, the deeper silicon nitride layer 24, the less likely subsequent etching steps are to disturb the layer.

The present invention offers the advantage of improving upon the prior art P+ sheet resistance which was approximately 20 Ohms per square or more. With a diffused P+ region formed prior to the base implant, a P+ sheet resistance of as low as 7 Ohms per square or even lower may be obtained. The ultimate sheet resistance attainable is only limited by the lateral spacing constraints of the process geometry. The lateral constraints will be a factor since the deeper the P+ diffusion, the more the P+ region will impinge on the emitter next to it, because of the lateral diffusion always present with any significant diffusion depth. Thus, significant reductions in the extrinsic base resistance due to the lateral P+ diffusion may be realized. The high resistivity base of the prior art is in effect replaced with the P+ region. This has the additional benefit of allowing for a higher figure of merit, defined as the ratio of emitter area to base area, by narrowing the P+ opening due to lower sheet resistance.

Additionally, the present invention eliminates the need for thick masking layers for high energy boron implants of the P+ regions. Finally, eliminates any drive requirements for the P+ implant, such that shallower final diffusion depths for both base and emitter regions may be obtained, resulting in higher performance devices. For example, elimination of the P+ implant drive requirements of the prior art makes possible a higher $f_T$ of the bipolar transistor device, where $f_T$ is defined as the frequency at which the $\beta$ and the current gain of the device are equal to unity, i.e. $|\beta|^2 = 0$ dB.

While the invention has been particularly shown and described with reference to a preferred embodiment, it will be understood by those skilled in the art that various changes in form and detail may be made therein without departing from the spirit and scope of the invention.

What is claimed is:

1. A method for manufacturing a self-aligned, shallow diffused bipolar transistor semiconductor device, comprising the steps of:

forming a first oxide layer on the top surface of an epitaxial layer;

etching a moat in the first oxide layer;

forming a P− region in the epitaxial layer below the moat, by performing a P− implant and drive of the moat into the epitaxial layer below the moat and in the process defining a second oxide layer in the moat on the top surface of the epitaxial layer which is shallower than the first oxide layer;

defining a base opening on the top surface of the epitaxial layer by etching away a portion of the first oxide layer and a portion of the second oxide layer;

growing a third oxide layer over the first oxide layer, the second oxide layer, and in the base opening;

forming an insulating layer over the third oxide layer;

patterning and etching portions of the insulating layer to define an emitter region, a P+ area, and a plurality of insulating spacers;

forming a fourth oxide layer over the insulating spacers and the insulating layer;

patterning and etching the fourth oxide layer to define a P+ region opener of the P+ area;

forming a P+ region in the P+ area, wherein the P+ region has a resistance which may be measured;

uncovering the emitter region by etching away the fourth oxide layer;

forming a fifth oxide layer over the emitter region and the P+ region;

implanting the fifth oxide layer with a P− base material at an implantation energy sufficient to penetrate the insulating spacers and place the peak dosage of the P− base material under the insulating spacers;

forming a linked base region by performing an implant activation and partial drive of the P− base material;

defining an emitter opener by etching away a portion of the fifth oxide layer over the emitter region; and implanting the emitter region with Arsenic.

2. The method of claim 1, wherein the P− implant and drive uses Boron $B_{11}$.

3. The method of claim 1, wherein the third oxide layer has a depth of approximately 200 Å to 250 Å.

4. The method of claim 1, wherein the insulating layer is formed by chemical vapor deposition (CVD).

5. The method of claim 1, wherein the insulating layer is approximately 600 Å to 1000 Å in depth.

6. The method of claim 5, wherein the insulating layer is silicon nitride.

7. The method of claim 1, wherein the third oxide layer and the insulating layer together form an emitter-P+ (E-P) mask.

8. The method of claim 1, wherein the fourth oxide layer is formed by chemical vapor deposition (CVD ).

9. The method of claim 1, wherein the P+ region has a resistivity of less than approximately twenty Ohms per square 10. The method of claim 1, wherein the P+ region is formed by depositing and driving P+ material in the P+ area.

11. The method of claim 10, wherein the P+ material is Boron Chloride $BCl_3$.

12. The method of claim 10, wherein the P+ material is Boron Nitride BN.

13. The method of claim 1, wherein after the step of forming a P+ region and before the step of uncovering the emitter region, measuring the resistance of the P+ region.

14. The method of claim 1, wherein the fifth oxide layer is formed by oxidation at approximately 900° C. to 950° C. in dry oxygen.

15. The method of claim 1, wherein the fifth oxide layer is approximately 300 Å to 500 Å in depth.

16. The method of claim 1, wherein the fifth oxide layer is implanted with Boron $B^{11}$.

17. The method of claim 1, wherein the implantation energy sufficient to penetrate the insulating spacers is approximately 35 to 40 KEV.

18. The method of claim 1, wherein after the step of implanting the emitter region with Arsenic, the additional step of capping the emitter region to prevent evaporation of the Arsenic.

19. The method of claim 18, wherein the emitter region is capped with a sixth oxide layer to prevent evaporation of the Arsenic.

* * * * *